United States Patent
Lee et al.

(10) Patent No.: US 8,174,114 B2
(45) Date of Patent: May 8, 2012

(54) SEMICONDUCTOR PACKAGE STRUCTURE WITH CONSTRAINT STIFFENER FOR CLEANING AND UNDERFILLING EFFICIENCY

(75) Inventors: Chien-Hsiun Lee, Hsinchu (TW); Yk Hsiao, Hsinchu (TW)

(73) Assignee: Taiwan Semiconductor Manufacturing Go. Ltd., Hsin-Chu (TW)

( * ) Notice: Subject to any disclaimer, the term of this patent is extended or adjusted under 35 U.S.C. 154(b) by 95 days.

(21) Appl. No.: 11/300,328

(22) Filed: Dec. 15, 2005

(65) Prior Publication Data

US 2007/0145571 A1    Jun. 28, 2007

(51) Int. Cl.
*H01L 23/34*    (2006.01)

(52) U.S. Cl. .......................... 257/713; 257/712; 257/706

(58) Field of Classification Search .................. 257/712, 257/713, E23.101, E23.09, 717, 706; 361/714, 361/719
See application file for complete search history.

(56) References Cited

U.S. PATENT DOCUMENTS

| | | | | |
|---|---|---|---|---|
| 4,561,011 A | * | 12/1985 | Kohara et al. | 257/713 |
| 5,297,006 A | * | 3/1994 | Mizukoshi | 361/704 |
| 5,773,879 A | * | 6/1998 | Fusayasu et al. | 257/678 |
| 6,011,304 A | * | 1/2000 | Mertol | 257/706 |
| 6,224,711 B1 | * | 5/2001 | Carden et al. | 156/311 |
| 6,459,152 B1 | * | 10/2002 | Tomita et al. | 257/738 |
| 6,552,266 B2 | * | 4/2003 | Carden et al. | 174/535 |
| 6,787,900 B2 | * | 9/2004 | Shinohara et al. | 257/718 |
| 6,825,556 B2 | * | 11/2004 | Joshi et al. | 257/707 |
| 2002/0163075 A1 | * | 11/2002 | Ho et al. | 257/712 |
| 2003/0030140 A1 | * | 2/2003 | Shim | 257/712 |
| 2005/0040520 A1 | * | 2/2005 | Wang | 257/720 |

* cited by examiner

*Primary Examiner* — Wael Fahmy
*Assistant Examiner* — Sarah Salerno
(74) *Attorney, Agent, or Firm* — Birch, Stewart, Kolasch & Birch, LLP

(57) ABSTRACT

A semiconductor package structure with a heat dissipating stiffener and method of fabricating the same are provided. In one embodiment, the package structure comprises a substrate having a front side and a back side; a semiconductor chip mounted on the front surface of the substrate; a thermally-conductive stiffener mounted over the front surface of the substrate and surrounding the chip, the stiffener having a first portion and a second portion, wherein the first portion is wider than the second portion so as to allow for easy egress of a dispenser into a gap between the chip and the substrate; an underfill layer filled and cured in the gap; and a plurality of solder balls mounted on the back surface of the substrate.

8 Claims, 3 Drawing Sheets

SEMICONDUCTOR PACKAGE STRUCTURE WITH CONSTRAINT STIFFENER FOR CLEANING AND UNDERFILLING EFFICIENCY

BACKGROUND OF THE INVENTION

1. Field of the Invention

The present invention relates generally to the fabrication of semiconductor chip packages, and more particularly, to a semiconductor package structure having a constraint stiffener for efficient cleaning and underfilling of a chip mounted on a substrate.

2. Brief Discussion of the Related Art

In the microelectronics industry, a chip carrying an integrated circuit is commonly mounted on a package carrier, such as a substrate, a circuit board or a leadframe, that provides electrical connections from the chip to the exterior of the package. In one such packaging arrangement called flip chip mounting, the chip includes an area array of electrically conductive contacts, known as bond pads, that are electrically connected to corresponding area array of electrically-conductive contacts on the substrate, known as solder balls or bumps. Typically, the solder bumps are registered with the bond pads and a reflow process is applied to create electrical connections in the form of solder joints between the chip and the substrate. The process of flip chip mounting results in a space or gap between the chip and the substrate.

The chip and the substrate are usually formed of different materials having mismatched coefficients of thermal expansion. As a result, the chip and the substrate experience significantly different dimension changes when heated that creates significant thermally-induced stresses in the electrical connections between the chip and the substrate. If uncompensated, the disparity in thermal expansion can result in degradation in the performance of the chip, damage to the solder joints, or package failure. As the size of the chip increases, the effect of a mismatch in the coefficient of thermal expansion between the chip and the substrate becomes more pronounced. In stacked die packages, the mismatch in coefficient of thermal expansion between the die laminate and the package may be even greater than in single die packages. The failure mechanism in stacked die packages may shift from solder joint damage to die damage.

To improve the reliability of electrical connections in flip chip package assemblies, it is common in the microelectronics industry to fill the gap between the chip and the substrate with an encapsulant material, or underfill. The underfill increases the fatigue life of the package and improves the reliability of the electrical connections by reducing the stress experienced by the electrical connections during thermal cycling or when the chip and the substrate have a significant temperature differential. The underfill also isolates the electrical connections from exposure to the ambient environment by hermetically sealing the gap and lends mechanical strength to the package assembly for resisting mechanical shock and bending. The underfill further provides a conductive path that removes heat from the chip and that operates to reduce any temperature differential between the chip and the substrate. As a result, the underfill significantly increases the lifetime of the assembled package.

To further enhance the rigidity of the package assembly, stiffeners are typically employed in the package assembly. Due to the highly rigid material of the stiffener, the package assembly would be less likely to be subject to package warpage.

In the conventional package assembly, prior to dispensing the underfill in the gap between the chip and the substrate, a cleaning solvent is injected to the gap to clean away remnant solder flux. However, a drawback is that the cleaning solvent would be partly obstructed by the stiffener, making the cleaning process very difficult to carry out efficiently and thoroughly. When some solder flux is still left, it would cause the subsequently formed flip chip underfill layer to have voids, which would considerably degrade the quality and reliability of the finished package product.

Another drawback to the conventional package assembly is that during the time the underfill is injected in the gap between the chip and the substrate, the underfill dispenser will be partly obstructed by the stiffener, making the underfill dispensing process a time consuming task and not easy to carry out thoroughly.

Accordingly, what is needed in the art is a semiconductor package structure having an improved stiffener design that overcomes the problems discussed above.

SUMMARY OF THE INVENTION

The present invention is directed to a semiconductor package structure with a heat dissipating stiffener and method of fabricating the same. In one embodiment, the package structure comprises a substrate having a front side and a back side; a semiconductor chip mounted on the front surface of the substrate; a thermally-conductive stiffener mounted over the front surface of the substrate and surrounding the chip, the stiffener having a first portion and a second portion, wherein the first portion is wider than the second portion so as to allow for easy egress of a dispenser into a gap between the chip and the substrate; an underfill layer filled and cured in the gap; and a plurality of solder balls mounted on the back surface of the substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and accompanying drawings, which are given by way of illustration only, and thus are not limitative of the present invention, and in which.

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Figure 1:
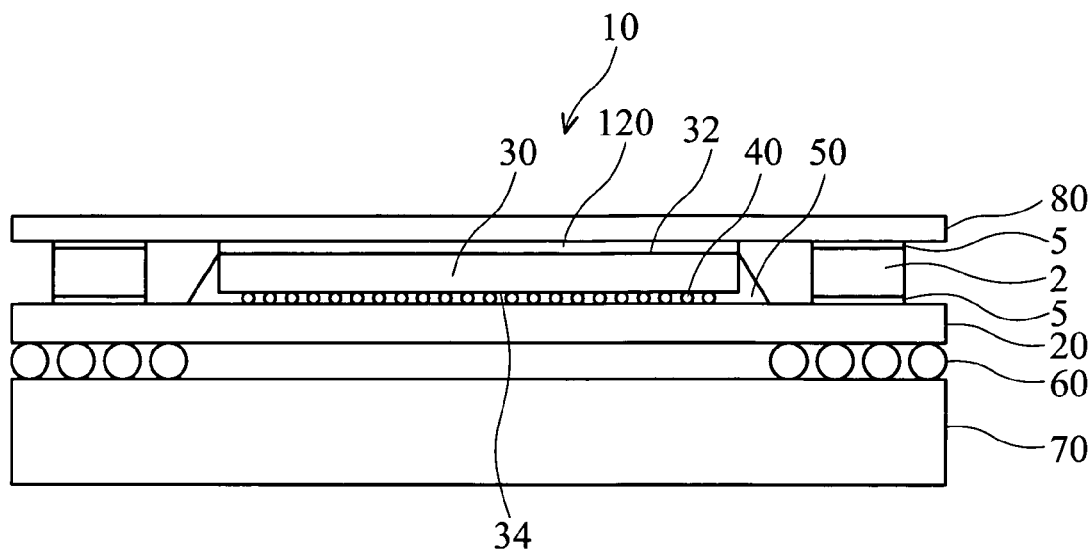
FIG. 1 is a cross-sectional view of a conventional semi-finished flip chip package showing a stiffener mounted to a substrate.

FIG. 1 is a cross-sectional view of a conventional semi-finished flip chip package showing a stiffener mounted to a substrate. Flip chip package 10 includes a chip 30 having an upper surface 32 and a lower surface 34 opposite the upper surface 32. A set of solder bumps 40 is connected to contact pads (not shown) on the lower surface 34 of chip 30. Chip 30 is secured to a first substrate 20 underlying chip 30. Solder bumps 40 are attached to contact pads (not shown) on an upper surface of first substrate 20. An underfill 50 may be filled between chip 30 and first substrate 20 to stiffen the flip chip package 10 and further protect chip 30 from flexural damage. A set of solder balls 60 may be secured to contact pads (not shown) on a lower surface of first substrate 20. Solder balls 60 may also be secured to contact pads (not shown) on a second substrate 70. The second substrate 70 may be a printed wire board (also sometimes called a printed circuit board) or may be a multilayer module known to those skilled in the art.

Figure 2:
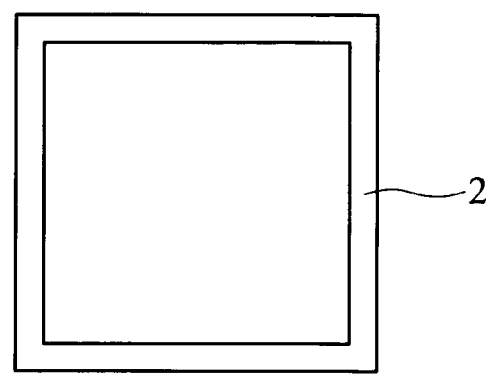
FIG. 2 is a top plan view of a conventional stiffener.

The flip chip package 10 may also include a heat spreader 80 and stiffener 2 for preventing excess warpage of the package. Heat spreader 80 is mounted on top of chip 30 to dissipate heat generated by chip 30 and to counter-balance the forces exerted by the thermal expansion mismatches between at least the chip 30 and the first substrate 20. Stiffener 2 is mounted between first substrate 20 and heat spreader 80 by means of adhesives 5. A top plan view of stiffener 2 is shown in FIG. 2. The conventional flip chip package 10 may also include a thermal interface material (TIM) 120 disposed between chip 30 and heat spreader 80 for transferring the heat generated by chip 30 to heat spreader 80.

Figure 3:
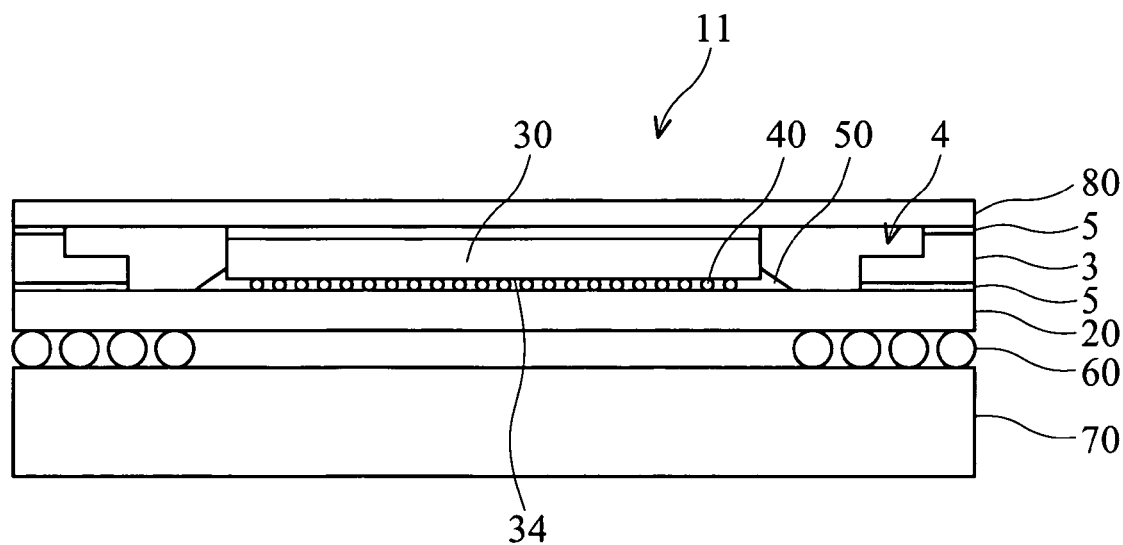
FIG. 3 is a cross-sectional view of a semi-finished flip chip package showing a stiffener mounted to a substrate according to one embodiment of the present invention.

Reference will now be made in detail to the present preferred embodiments of the present invention. Embodiments of the invention are disclosed with reference to FIGS. 3, 4, and 5. FIG. 3 is a cross-sectional view of a semi-finished flip chip package showing a stiffener mounted to a substrate according to one embodiment of the present invention. Flip chip package 11 includes a first substrate 20; a stiffener 3 adhered to the front surface of first substrate 20 by means of an adhesive 5; a chip 30 bonded to the front surface of the first substrate 20 by means of solder bumps 40 and accommodated within the stiffener 3; an underfill 50 filled and cured in the gap between the chip 30 and the first substrate 20; and a plurality of solder balls 60 mounted on the back surface of the first substrate 20.

Figure 4:
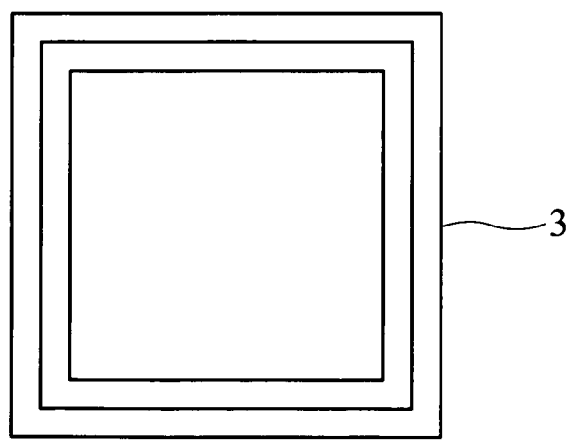
FIG. 4 is a top plan view of a stiffener according to one embodiment of the present invention.

Stiffener 3 preferably has as much surface area mounted to first substrate 20 as possible, so that it can aid, to as great an extent as possible, in structurally reinforcing the flip chip package 11 against twisting and warping. The dimensions of the stiffener 3 is largely determined by the size of the package and is dependent on at least the size and shape of the first substrate 20. Stiffener 3 comprises a first portion (lower) and a second portion (upper), wherein the first portion is wider than the second portion, thereby creating an indentation 4 in stiffener 3. FIG. 4 is a top plan view of stiffener 3 according to one embodiment of the present invention. The first and second portions are so dimensioned so as to allow for better egress of a dispenser needle into the gap between the chip 30 and the first substrate 20. In one embodiment of the present invention, the first portion of the stiffener has a width of from about 50 μm to about 12,000 μm and a height of from about 50 μm to about 1,500 μm. In another embodiment, the second portion of the stiffener has a width of from about 50 μm to about 12,000 μm and a height of from about 50 μm to about 1,500 μm. However, one skilled in the art will understand that stiffener 3 is so dimensioned so as to allow for easy egress of a dispenser into the gap. A heat spreader 80 may be mounted over the second portion of stiffener 3 by means of adhesive 5 for sealing the chip 30 therein.

Stiffener 3 has an opening therein for surrounding the chip 30. It is understood that the size of the opening and therefore the stiffener 3 is dependent upon the size of chip 30, which stiffener 3 must receive and surround. Preferably, the opening and stiffener 3 are sized so as to maximize the surface area of stiffener 3 that can be mounted to first substrate 20, so as to reduce twisting and warping as much as possible.

Stiffener 3 is formed of a rigid material. In one embodiment, stiffener 3 comprises a metal, such as for example, copper. In another embodiment, stiffener 3 comprises a ceramic material. In yet another embodiment, stiffener 3 comprises a silicon containing material. However, one skilled in the art will understand that stiffener 3 may be made from any material, which provides a sufficient degree of rigidity to flip chip package 11 against warpage and twisting. Furthermore, stiffener 3 is made of a material that has a coefficient of thermal expansion (CTE) substantially equal to the CTE of first substrate 20, and thermally conductive to provide high heat dissipation efficiency.

Figure 5:
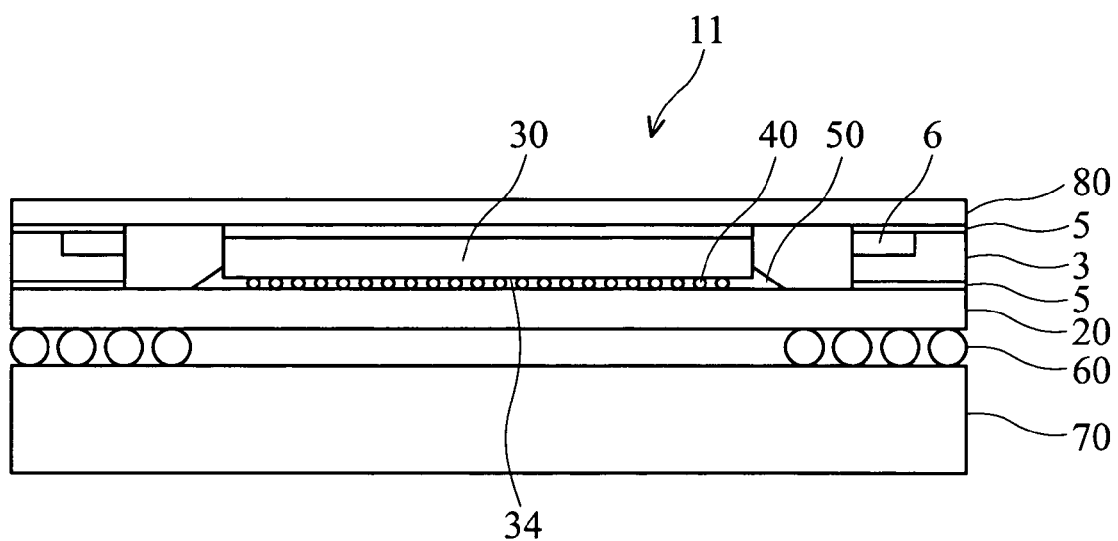
FIG. 5 is a cross-sectional view of a semi-finished flip chip package showing an attachment mounted to a stiffener according to one embodiment of the present invention.

In one fabrication process, after stiffener 3 is assembled in position, the chip 30 can be mounted through the stiffener 3 onto the front surface of first substrate 20. After this process, a cleaning solvent may be injected through the indentation 4 into the gap between the chip 30 and the first substrate 20 for the purpose of cleaning away remnant solder flux in the gap. Next, a flip chip underfill process may be performed to form an underfill 50 in the gap between the chip 30 and the first substrate 20. After the underfill process has been completed, to further enhance the rigidity of flip chip package 11, as shown in FIG. 5, an attachment 6 may be coupled to the first and second portions of stiffener 3 by means of an epoxy, for example. In another embodiment, the attachment 6 may be a single unit with heat spreader 80 for mounting over the first and second portions of stiffener 3 for sealing chip 30 therein.

It is understood from the foregoing description that the flip chip package 11 of the invention allows the cleaning solvent dispenser used in the solder flux cleaning process to be unobstructed by the stiffener 3 due to indentation 4 so that the cleaning solvent can be more smoothly injected into the gap between the chip 30 and the first substrate 20. This benefit allows the subsequently formed underfill 50 to be substantially free of voids, and therefore, the finished package is more assured in quality and reliability. Moreover, due to the indentation 4 in stiffener 3, a dispenser needle for dispensing an underfill in the gap between the chip and the substrate will not be partly obstructed by the stiffener, thus making the underfill dispensing process quicker and easier to carry out than in the conventional processes.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor package structure, comprising:
a substrate having a front side and a back side;

a semiconductor chip directly mounted on the front surface of the substrate by means of solder bumps;

a thermally-conductive stiffener mounted over the front surface of the substrate and surrounding the chip, the stiffener having a first portion and a second portion, wherein a top surface of the first portion is between a top surface and a bottom surface of the semiconductor chip to form an indentation between the semiconductor chip and the second portion surrounding the semiconductor chip, the second portion is directly disposed on the top surface of the first portion, the first portion adjoins the substrate, and the first portion of the stiffener is spaced apart from the chip;

an underfill layer filled and cured in a gap between the semiconductor chip and the substrate;

a plurality of solder balls mounted on the back surface of the substrate; and a heat spreader in contact with the second portion for sealing the semiconductor chip therein by an adhesive interposed between the heat spreader and the second portion, wherein the first portion is wider than the second portion thereby creating an indentation between the heat spreader and the first portion.

2. The semiconductor package structure of claim 1, wherein the first portion of the stiffener is so dimensioned so as to allow for easy egress of a dispenser into the gap.

3. The semiconductor package structure of claim 1, wherein the second portion of the stiffener has a width of from about 50 μm to about 12,000 μm and a height of from about 50 μm to about 1,500 μm.

4. The semiconductor package structure of claim 1, wherein the second portion of the stiffener has a width of from about 50 μm to about 12,000 μm and a height of from about 50 μm to about 1,500 μm.

5. The semiconductor package structure of claim 1, further comprising an attachment for coupling to the first and second portions of the stiffener thereby enhancing the rigidity thereof.

6. The semiconductor package structure of claim 5, wherein the attachment is coupled to the first and second portions of the stiffener by epoxy.

7. The semiconductor package structure of claim 1, wherein the thermally-conductive stiffener is L-shaped in a cross-sectional view thereof.

8. The semiconductor package structure of claim 1, wherein the thermally-conductive stiffener is a two-step structure.

* * * * *